(12) United States Patent
Makienko et al.

(10) Patent No.: US 6,472,833 B2
(45) Date of Patent: Oct. 29, 2002

(54) LASER CATHODE RAY TUBE

(75) Inventors: Oleg Mikhailovich Makienko, Moskovskaya oblast (RU); Nikolai Grigoryevich Rumyantzen, deceased, late of Moscow Region (RU), Yury Vladimirivigh Petrushenko, legal representative; Jong-Sik Choi, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 09/796,739

(22) Filed: Mar. 2, 2001

(65) Prior Publication Data

US 2002/0057384 A1 May 16, 2002

(30) Foreign Application Priority Data

Mar. 2, 2000 (RU) .......................................... 00105121

(51) Int. Cl.[7] .................................................. G09G 1/04
(52) U.S. Cl. .................... 315/382.1; 315/382; 315/371; 313/2.1; 313/463
(58) Field of Search ............................. 315/382.1, 382, 315/370, 371, 379, 383, 5, 5.12, 5.14; 313/2.1, 463

(56) References Cited

U.S. PATENT DOCUMENTS

| | | | | |
|---|---|---|---|---|
| 3,558,956 A | | 1/1971 | Basov et al. ................... 313/92 |
| 5,170,181 A | * | 12/1992 | Tamada ....................... 346/108 |
| 5,280,360 A | | 1/1994 | Derdyra et al. .............. 358/242 |
| 5,374,870 A | * | 12/1994 | Akhekyan et al. .......... 313/463 |
| 5,687,185 A | * | 11/1997 | Kozlovsky et al. ........... 372/43 |
| 6,329,966 B1 | * | 12/2001 | Someya et al. ................ 345/22 |
| 6,331,749 B1 | * | 12/2001 | Makienko et al. ........... 313/2.1 |

* cited by examiner

*Primary Examiner*—Don Wong
*Assistant Examiner*—Tuyet T. Vo
(74) *Attorney, Agent, or Firm*—Staas & Halsey LLP

(57) ABSTRACT

A laser CRT includes a cathode, a modulator having an orifice for forming an electron beam from the electrons emitted by the cathode, and a beam directing unit directing the electron beam formed by the orifice of the modulator to the laser screen of the laser CRT. To reduce the diameter of the electron beam and to thereby improve the resolution of the laser CRT, the laser CRT includes at least one other modulator having an orifice for forming another electron beam from the electrons emitted by the cathode, the beam directing unit being adapted for directing the other electron beam formed by the at least one other modulator to the laser screen.

20 Claims, 1 Drawing Sheet

LASER CATHODE RAY TUBE

CROSS-REFERENCE TO RELATED APPLICATIONS

This application is based on Russian Application No. 2000105121, filed Mar. 2, 2000, in the Russian Patent Office, the disclosure of which is incorporated herein by reference.

BACKGROUND OF THE INVENTION

1. Field of the Invention

The present invention relates to electronic and quantum devices, and more particularly, to laser cathode-ray tubes, e.g., used in projection television systems for displaying images on large screens.

2. Description of the Related Art

Projection television equipment based on conventional cathode-ray tubes (CRT) having a luminescent screen is widely used for displaying images on projective screens having an area of up to several square meters. However, the size of an image on the projective screens of such equipment is limited because luminescent screens cannot form light flux of high intensity, thus making it difficult to form television images having required brightness and contrast.

An effective way to improve the parameters of projection television systems is connected with using laser CRTs (see, for example, U.S. Pat. No. 3,558,956).

As distinct from conventional CRTs, the source of radiation in the laser CRT is a laser target, not a luminescent layer, the laser target being a thin semiconductor mono-crystalline plate having both its parallel surfaces covered by light reflecting coatings. A fully reflecting mirror metal coating is usually applied to the surface on which the electron beam is incident, while the opposite side of the plate is covered with a semitransparent mirror coating.

The mirror surfaces constitute an optical resonator, while the semiconductor plate between them acts as an active medium of the laser with electron-beam excitation (pumping). The laser target is fixed to a substrate of a transparent dielectric material, the substrate serving as the optical output window of the laser CRT and also as a heat sink for the laser target. The substrate is usually made of sapphire having a high thermal conductivity. The laser target together with the transparent substrate constitute the screen of the laser CRT (laser screen).

The electron beam penetrates into the semiconductor plate through the metal coating and induces spontaneous light radiation. When the surface density of the current produced by the beam on the laser target exceeds a threshold value, the power of the induced light radiation will be greater than the losses in the optical resonator and the element of the target on which the electron beam is incident will generate laser radiation.

When the light passes repeatedly through the optical resonator, its spectrum narrows, with the result that the emitted light is substantially monochromatic. The laser light is radiated through the semitransparent mirror coating in essence perpendicularly to the surface of the semiconductor plate and leaves the CRT through the sapphire output window.

Known is a laser CRT (U.S. Pat. No. 5,280,360) including a cathode, a modulator having an orifice for forming a beam from the electrons emitted by the cathode, and means for directing the beam formed by the orifice of the modulator to the laser screen of the CRT. During the operation of this laser CRT, an electron beam is formed by the modulator from the electrons emitted by the cathode, and it is directed to the laser screen for excitation of laser radiation.

The resolution of a laser CRT is determined by the diameter of the electron beam in the plane of the laser screen. The influence of an aberration of the focusing magnetic or electrostatic lens and other known factors, including mutual repulsion of the electrons constituting the beam, make it impossible to focus the electron beam absolutely precisely in an indefinitely small point on the surface of the screen.

With the above-mentioned disturbing factors taken into account, a sharper focusing of the beam may be provided by reducing the original cross-section of the electron beam, said cross-section being determined by the diameter of the modulator orifice. Generally, the smallest possible diameter of the light spot formed on the laser screen by a focused electron beam is approximately proportional to the diameter of the orifice of the modulator. To increase the resolution of a laser CRT, the diameter of the modulator orifice should be made as small as possible.

At the same time, with the value of the cathode current density being constant, the current of the electron beam is proportional to the area of the modulator orifice. Therefore, if the diameter of the modulator orifice is made smaller, the current density of the cathode must be raised to maintain the required operating beam current, ensuring the required intensity of the laser radiation provided by the CRT.

However, the maximum current density that can be provided by modern cathodes is about 10 $A/cm^2$. That is, given the operating beam current equal to, e.g., 1 mA, the diameter of the modulator orifice cannot be made less than 0.11 mm.

With the diameter of the CRT screen of 60 mm and with the effects of spherical aberration taken into account, a modulator having an orifice diameter of 0.11 mm makes possible formation of a spot having a diameter of about 25 microns on the laser screen. In some instances such resolution is not sufficient.

SUMMARY OF THE INVENTION

It is an object of the present invention to provide a laser CRT and a method of its operation which make reducing the diameter of the modulator orifice possible, thereby increasing the resolution of the laser CRT, while maintaining the required intensity of the laser radiation provided by the laser CRT.

Additional objects and advantages of the invention will be set forth in part in the description which follows and, in part, will be obvious from the description, or may be learned by practice of the invention.

In order to achieve the above and other objects, the laser CRT includes a cathode emitting electrons, a modulator having an orifice for forming a beam from the electrons emitted by the cathode, and a beam directing unit for directing the beam formed by the orifice of the modulator to a laser screen, wherein the modulator includes at least one further modulator having an orifice for forming a further beam from the electrons, wherein the beam directing unit is adapted for directing the further beam formed by the at least one further modulator to the laser screen.

The employment of additional modulators makes it possible to form additional light spots on the laser screen, and thus the required intensity of the laser radiation is still provided when smaller diameters of the orifices of the modulators are used. The reduction in the diameters of the orifices results in reduction in the diameters of the electron beams formed by the modulators, whereby the resolution of the laser CRT is improved.

The beam directing unit which directs the electron beam preferably comprises a common focusing system focusing the beams formed by the modulator orifices on the laser screen of the CRT, and a common deflection system deflecting the beams formed by the modulator orifices.

The diameters of the orifices of all the modulators are preferably selected to be approximately equal. The equal diameter of the orifices ensures the highest resolution of the laser CRT, because the resolution is determined by the maximum diameter of a light spot on the laser screen.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, wherein.

DETAILED DESCRIPTION OF THE PREFERRED EMBODIMENTS

Figure 1:
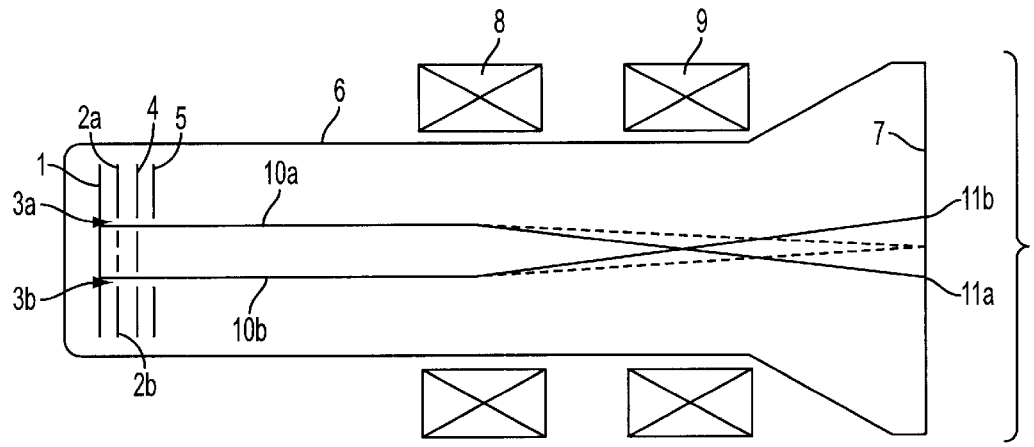
FIG. 1 schematically shows a sectional view of a laser CRT according to the invention.

The laser CRT shown in FIG. 1 includes a cathode 1 of a conventional design, the cathode 1 having an electron emitting surface heated by a filament glower (not shown).

The laser CRT shown in FIG. 1 has two modulators 2a and 2b, each of the modulators respectively having an orifice 3a and 3b for forming beams from the electrons emitted by the cathode 1. In other embodiments, the number of modulators can be more than two. The diameters of the orifices 3a and 3b may be approximately the same and are selected depending on the current density provided by the cathode 1 of the type used and on the required intensity of the laser radiation provided by the laser CRT.

To achieve the highest possible resolution, the orifices 3a and 3b of the modulators 2a and 2b have the smallest possible diameter still providing the operating currents of the beams sufficient for producing an image having a required brightness, the operating currents being determined by the orifice diameters and by the current density provided by the cathode 1.

Downstream of the modulators 2a and 2b an accelerating electrode 4 is installed, the accelerating electrode 4 having two orifices respectively aligned with the orifices 3a and 3b of the modulators 2a and 2b. Downstream of the accelerating electrode 4 an anode 5 of a conventional design is arranged.

The modulators 2a and 2b may be of any suitable design, including such as used in luminescent multiple-beam CRTs. A modulator diaphragm may, e.g., be divided into sectors, the number of which corresponds to the number of beams (into two halves for a two-beam CRT).

The sectors are joined by insulating ceramics in a conventional way, forming an assembly unified with the cathode and accelerating electrode, the orifices being made during assembly by a spark method.

Each of the modulators 2a and 2b may be connected in a conventional way to a separate lead (not shown) of the laser CRT for feeding an external video signal.

The cathode 1, modulators 2a and 2b, accelerating electrode 4 and anode 5 are installed in an evacuated glass bulb 6. At the end of the bulb 6 a laser screen 7 having a semiconductor laser target (not shown) is installed.

On the outer surface of the bulb 6 a common electromagnetic focusing system 8 and a common electromagnetic deflection system 9 are mounted. The common electromagnetic focusing system 8 is arranged for focusing the electron beams formed by the modulators 2a and 2b.

The common deflection system 9 includes electromagnetic coils (not shown) for vertical and horizontal deflection of the electron beams formed by the modulators 2a and 2b. Other suitable types of focusing and deflection systems may also be used. The common focusing and deflection systems 8 and 9 constitute a beam directing unit directing the electron beams formed by the modulator orifices 3a and 3b to the laser screen of the CRT.

To simplify the drawings, other conventional elements of the laser CRT, which have no direct relation to the present invention, are not shown.

The laser CRT operates as follows.

The cathode 1 heated with the help of an external current source (not shown) emits electrons. Corresponding voltages positive in relation to the cathode 1 are applied to the accelerating electrode 4, anode 5 and the target of the laser screen 7.

When a cut-off voltage, i.e., a sufficiently large potential negative in relation to the cathode 1, is applied to the modulator 2a or 2b, the electrons emitted by the cathode 1 do not pass through the orifice 3a or 3b of the modulator 2a or 2b and an electron beam is not formed.

The modulator that will form an electron beam is fed with a bias potential with respect to the cathode 1, the bias potential being such as to allow passage of the electrons emitted by the cathode 1 through the orifice of the modulator and their movement under the action of the voltages applied to the accelerating electrode 4, anode 5 and the target of the laser screen 7 through the orifices of the accelerating electrode 4 and anode 5 in the direction of the laser screen 7.

When the electrons pass through a corresponding orifice 3a or 3b of the modulator 2a or 2b, the electrons form electron beams 10a and 10b, the cross-section of the electron beams being determined by the diameter of the orifices 3a and 3b of the modulators 2a and 2b, respectively.

The currents of the respective electron beams 10a and 10b are controlled by video signal voltages applied to the modulators 2a and 2b from an external source of video signals (not shown).

The formed electron beams 10a and 10b are focused on the laser screen 7 with the help of the common focusing system 8. For this purpose a current is passed through an electromagnetic coil of the focusing system 8 to provide point magnetic focusing of the electron beams 10a and 10b on the laser target of the screen 7.

During magnetic focusing, the magnetic field produced by the focusing system 8 forms a magnetic lens which collects the electron beams into narrow converging beams.

These beams 10a and 10b fall on the target of the laser screen 7 and excite laser radiation in the form of light spots 11a, 11b, the dimensions of the light spots being determined by the cross-section of the electron beams 10a, 10b in the plane of the laser screen 7.

Deflection of the formed electron beams 10a, 10b is accomplished by the common deflection system 9. The electromagnetic coils of the deflection system 9 are supplied with horizontal and vertical scanning signals of a saw-tooth form. The magnetic fields of the electromagnetic coils deflect the electron beams 10a, 10b in horizontal and vertical directions, forming a television raster in the same way as it is formed in known CRTS.

To correct inaccuracies in the spatial adjustment of the electron guns, the laser CRT can be provided with an adjustment unit similar to those used in conventional color three-beam CRTs. This unit can, for example, be comprised of magnets (not shown) disposed on the outside of the bulb 6, or represent any other known means for spatial adjustment of electron beams.

The synchronized supply of the laser CRT with scanning and video signals provides formation of a television image projected from the laser screen 7 of the laser CRT to an external projective screen (not shown).

There are two possible modes of operation of a laser CRT having two or more modulators, the mode of simultaneously forming the electron beams and the mode of alternately forming the electron beams by the modulators.

If the alternate formation of the electron beams is used, at any time instant only one of the modulators forms an electron beam, while cut-off voltages are applied to the other(s). In so doing the modulators 2a and 2b form electron beams in turn, i.e., when the modulator 2a forms an electron beam directed to the laser screen 7, the cut-off voltage is applied to the modulator 2b, and, on the contrary, when the cut-off voltage is not applied to the modulator 2b and it forms an electron beam, the cut-off voltage is applied to the modulator 2a.

In such a case the electron beams alternately formed by the modulators 2a and 2b may respectively form successive lines of the television raster on the laser screen during the horizontal scan.

Figure 2:
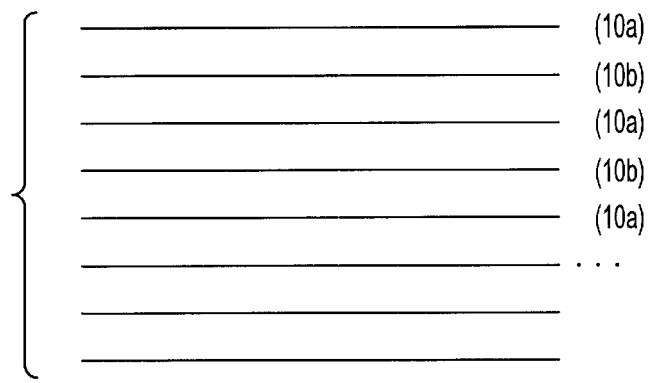
FIG. 2 illustrates formation of the television raster in a laser CRT according to an embodiment of the invention.

For example, as shown in FIG. 2, the first raster line may be produced by the beam 10a, the second line by the beam 10b, the third line by the beam 10a again, and so on.

The alternate operation of each of the modulators 2a, 2b thus ensures a pulse mode of operation of the cathode area located in front of the orifice 3a, 3b of a corresponding modulator 2a, 2b.

In a pulse mode of operations the maximum current density produced by the cathode 1 can be much greater than in a continuous mode. This makes it possible to provide an electron beam operating current sufficient to ensure the required intensity of the laser radiation produced by the laser CRT with a much smaller diameter of the modulator orifices than in a laser CRT having only one modulator.

It allows improvement in the resolution of the laser CRT by reducing the diameter of the orifices 3a, 3b of the modulators 2a, 2b and thereby produces narrower electron beams.

The alternate formation of the electron beams 10a and 10b by the modulators 2a and 2b makes it easy to focus each of these beams separately and to finely control their deflection using the common focusing system 8 and the common deflection system 9.

In addition, the alternate formation of the beams by the modulators 2a, 2b is beneficial for increasing the cathode durability which mainly determines the service life of a laser CRT.

If the simultaneous formation of the electron beams is used, the modulators 2a and 2b simultaneously form two electron beams 10a and 10b, which simultaneously form two light spots 11a and 11b on the laser screen.

In such a case, in a laser CRT having two or more modulators, two or more light spots are respectively formed on the laser screen. This provides a corresponding increase in the radiation intensity, as compared with a laser CRT having one modulator, or, with a given radiation intensity, a reduction in the diameter of the orifice of each of the modulators.

This, in turn, provides reduction in the diameters of the electron beams formed by the modulators and a corresponding improvement in the resolution of the laser CRT without an increase in the cathode current density.

For example, in the laser CRT shown in FIG. 1 the diameter of each of the light spots 11a and 11b is, as was mentioned above, approximately proportional to the diameter of the orifices 3a and 3b.

Because the electron beams 10a and 10b together provide approximately the same intensity of the laser radiation as one beam having the current equal to the sum of the currents of the electron beams 10a and 10b, the current of each of the electron beams 10a, 10b can be made approximately half as much as when only one electron beam is used.

As a result, the area of the orifices 3a, 3b of each of the modulators 2a, 2b and thus the area of each of the light spots 11a, 11b can be made half the size at the same current density of the cathode 1. In such a case, the diameters of the orifices 3a, 3b of the modulators 2a, 2b and the diameters of the spots 11a, 11b will be $\sqrt{2}$ times, i.e. about 1.4 times, smaller, and the resolution of the CRT will therefore be 1.4 times greater. The use of a greater number of beams will correspondingly provide an even greater improvement in the resolution.

In a laser CRT with simultaneous formation of electron beams, the mutual disposition of the electron guns formed by the modulators 2a, 2b, accelerating electrode 4 and anode 5, as well as the parameters of the common focusing system 8 and the common deflection system 9, can be selected such as to direct the electron beams 10a, 10b to different points of the laser screen 7 or to one point of the screen.

Figures 3A, 3B, 3C:
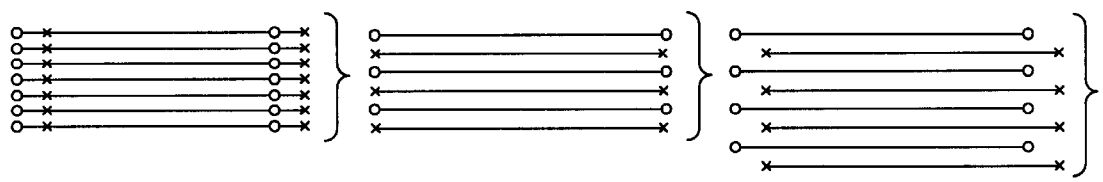
FIGS. 3A through 3C illustrate different variants of forming the television raster in a laser CRT according to another embodiment of the invention.

FIGS. 3A through 3C illustrate three examples of forming the television raster by two electron beams 10a, 10b directed to different points of the laser screen. The beginnings and ends of the lines scanned by the different beams are respectively indicated by circles and crosses.

Referring to FIG. 3A, during horizontal scan, the formed electron beams 10a, 10b are simultaneously directed to different adjacent points of the same horizontal line of the television raster formed on the laser screen 7. In this cases both the electron beams 10a, 10b simultaneously scan the same line of the television raster.

Referring to FIGS. 3B and 3C, the formed electron beams 10a, 10b are simultaneously directed respectively to adjacent lines of the television raster formed on the laser screen 7. E.g., the first line of the television raster is produced by the first beam 10a, the second line is produced by the second beam 10b simultaneously with the first line, the third line is again produced by the first beam 10a (after the simultaneous production of the first and second lines is completed) and so on.

In FIG. 3B the formed electron beams 10a, 10b are simultaneously directed to points located on one vertical line of the raster formed on the laser screen 7. FIG. 3C illustrates the case when the formed electron beams 10a, 10b are directed on points of adjacent lines of the television raster, with the points lying on a slanting line.

For each of the scan variants shown in FIGS. 3A through 3C, the setting of a required angle between the line on which the orifices 3a, 3b of the modulators 2a, 2b are located and the direction of the horizontal scan is accomplished by rotational displacement of the common deflection system 9 about the axis of the laser CRT.

Thus, to simultaneously scan one raster line by both the electron beams 10a, 10b (FIG. 3A), the deflection system 9 is positioned so that the direction of the horizontal scan is parallel to the line of the orifices 3a, 3b of the modulators 2a, 2b.

For accomplishment of the variant of scan shown in FIG. 3B, the deflection system 9 is positioned so that the direction of the horizontal scan is perpendicular to the line of the orifices 3a, 3b of the modulators 2a, 2b. In the case of the scan shown in FIG. 3C, the deflection system 9 shall be positioned so that the direction of the horizontal scan is at a given angle, e.g. 45°, to the line of the orifices 3a, 3b of the modulators 2a, 2b.

The choice of one of the variants of scan described above is determined by requirements for the resolution of the laser CRT in a vertical direction, the horizontal-sweep frequency and other specific requirements for the laser CRT.

As apparent, many other versions of the mutual disposition of the light spots on the laser screen are possible, in addition to the variants shown in FIGS. 3A through 3C.

The described design of the laser CRT with two modulators is presented only as an example. The required number of modulators, and thus of electron beams, is determined by the requirements for the intensity of the light radiation produced by the laser CRT, and its resolution.

In the device and method according to the invention any known ways of generation, focusing and deflection of electron beams, such as used in CRTs and other similar devices, can be used.

Any known types of laser screens and CRT bulbs and other additional devices and means, e.g. as disclosed in the cited references or as known in the art, can be used.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A laser cathode-ray tube having a laser screen, comprising:
   a single cathode emitting electrons;
   a first modulator corresponding to a part of the single cathode and having a first orifice forming a first electron beam from the emitted electrons;
   a second modulator corresponding to another part of the single cathode and having a second orifice forming a second electron beam from the emitted electrons; and
   a beam directing unit directing the first and second electron beams to the laser screen.

2. The laser cathode-ray tube of claim 1, wherein the beam directing unit comprises a deflection system deflecting the first and second electron beams to the laser screen.

3. The laser cathode-ray tube of claim 1, wherein diameters of the first and second orifices are approximately equal.

4. The laser cathode-ray tube of claim 1, further comprising:
   at least one additional modulator, each having an orifice for forming an electron beam from the electrons emitted by the cathode;
   wherein the beam directing unit directs the at least one additional electron beam to the laser screen.

5. The laser cathode-ray tube of claim 1, wherein diameters of the first and second orifices are determined by a current density of the cathode and a required intensity of laser radiation of the laser cathode-ray tube.

6. The laser cathode-ray tube of claim 1, wherein the beam directing unit comprises a focusing system focusing the first and second electron beams on the laser screen.

7. The laser cathode-ray tube of claim 6, wherein the beam directing means further comprises a deflection system deflecting the first and second electron beams to the laser screen.

8. The laser cathode-ray tube of claim 1, wherein the first and second orifices simultaneously form the first and second electron beams to form first and second light spots on the laser screen.

9. The laser cathode-ray tube of claim 8, wherein the first and second light spots are at different locations on the laser screen.

10. The laser cathode-ray tube of claim 8, wherein the first and second light spots are coincident with each other on the laser screen.

11. The laser cathode-ray tube of claim 8, wherein the first and second electron beams are simultaneously directed to different points of a same horizontal line of a television raster formed on the laser screen, and simultaneously scan the horizontal line.

12. The laser cathode-ray tube of claim 11, further comprising a deflection system deflecting the first and second electron beams to the laser screen, wherein a direction of a horizontal scan of the first and second electron beams is parallel to a line of the first and second orifices.

13. The laser cathode-ray tube of claim 8, wherein the first and second electron beams are simultaneously directed to adjacent horizontal lines of a television raster formed on the laser screen and located on one vertical line of the television raster, and simultaneously scan the respective adjacent horizontal lines.

14. The laser cathode-ray tube of claim 13, further comprising a deflection system deflecting the first and second electron beams to the laser screen, wherein a direction of a horizontal scan of the first and second electron beams is perpendicular to a line of the first and second orifices.

15. The laser cathode-ray tube of claim 8, wherein the first and second electron beams are simultaneously directed to adjacent horizontal lines of a television raster formed on the laser screen and offset from each other on a vertical line of the television raster, and simultaneously scan the respective adjacent horizontal lines.

16. The laser cathode-ray tube of claim 15, further comprising a deflection system deflecting the first and second electron beams to the laser screen, wherein a direction of a horizontal scan of the first and second electron beams is at an acute angle to a line of the first and second orifices.

17. The laser cathode-ray tube of claim 1, wherein the first and second orifices alternately form the first and second electron beams to form first and second light spots on the laser screen.

18. The laser cathode-ray tube of claim 17, wherein the first and second electron beams alternately form successive horizontal lines of a television raster during a horizontal scan.

19. A laser cathode-ray tube, comprising:
   a laser screen; and
   a plurality of modulators each having an orifice for forming an electron beam on the laser screen from a cathode, wherein the plurality of modulators simultaneously or alternately form the electron beams from the cathode.

20. A laser cathode-ray tube having a laser screen, comprising:

a cathode emitting electrons; and a plurality of modulators each having an orifice for forming an electron beam from the electrons emitted by the cathode on the laser screen.

* * * * *